United States Patent [19]

Bunner et al.

[11] Patent Number: 4,511,950

[45] Date of Patent: Apr. 16, 1985

[54] BACKPANEL ASSEMBLIES

[75] Inventors: Charles B. D. Bunner, Carp; David S. Brombal, Kanata, both of Canada

[73] Assignee: Northern Telecom Limited, Montreal, Canada

[21] Appl. No.: 507,734

[22] Filed: Jun. 27, 1983

[51] Int. Cl.³ .............................................. H05K 1/14
[52] U.S. Cl. .................. 361/413; 339/17 M; 361/412; 361/415
[58] Field of Search ........ 361/412, 413, 415; 339/17 M

[56] References Cited

U.S. PATENT DOCUMENTS

| | | | |
|---|---|---|---|
| 3,657,701 | 4/1972 | Garth | 361/412 X |
| 3,675,083 | 7/1972 | White | 361/413 |
| 3,755,630 | 8/1973 | Boyer | 361/415 X |
| 3,800,097 | 3/1974 | Maruscak et al. | 361/413 X |
| 3,993,935 | 11/1976 | Phillips et al. | 361/413 X |
| 4,179,172 | 12/1979 | Godsey et al. | 361/413 X |
| 4,195,896 | 4/1980 | Wagner et al. | 361/415 X |
| 4,307,438 | 12/1981 | Grubb | 361/412 X |
| 4,337,499 | 6/1982 | Cronin et al. | 361/415 X |
| 4,420,793 | 12/1983 | Strandberg | 361/412 X |
| 4,437,717 | 3/1984 | Korzik et al. | 339/17 M X |

Primary Examiner—R. R. Kucia
Attorney, Agent, or Firm—R. John Haley

[57] ABSTRACT

Each printed circuit board (PCB) on a backpanel has an associated set of power supply studs and power supply pins at an edge of the backpanel. The PCBs can be powered commonly via power supply buses interconnecting the studs. Alternatively, the PCBs can be powered individually via respective power supply PCBs which are inserted into connectors formed partly by the power supply pins and partly by pins on an additional, power supply, backpanel which is mounted to extend contiguously from and in the same plane as the first backpanel. The two arrangements can be combined to power groups of PCBs individually with all of the PCBs in each group being powered commonly.

10 Claims, 5 Drawing Figures

BACKPANEL ASSEMBLIES

This invention relates to backpanel assemblies, and is particularly concerned with a backpanel assembly which facilitates the supply of power to printed circuit boards (PCBs) inserted into PCB connectors of the backpanel assembly.

It is well known to provide electronic equipment, such as telecommunications equipment, with a backpanel having a plurality of elongate printed circuit board (PCB) connectors aligned in parallel thereon, into which PCBs are inserted to carry out desired functions. The backpanel, which for example is itself a multi-layer printed circuit board, provides desired interconnections between the PCBs, and enables the supply of signals and power thereto, via the PCB connectors.

In such equipment, if all of the PCBs are commonly supplied with power from a single power supply, then a failure of this power supply will result in a failure of the entire equipment. Accordingly, it is desirable to enable different parts of the equipment, for example each individual PCB, to be supplied with power from different power supplies, so that a failure of one of the power supplies affects only a single PCB and does not result in failure of the entire equipment. The different power supplies, for example d.c. converters, could be powered from a reliable power source, such as the 48 volt supply of a telephone central office in the case of telecommunications equipment.

On the other hand, it is also desirable to maintain the possibility of supplying power to all of the PCBs from a single power supply, so that the equipment can be initially provided at relatively low cost, and/or in cases where failure of the entire equipment, due to failure of the single power supply, can be tolerated.

Accordingly, an object of this invention is to provide a backpanel assembly which facilitates the supply of power to PCBs inserted into PCB connectors of the backpanel selectively from single or multiple power supplies.

According to this invention there is provided a backpanel assembly comprising a main backpanel having a plurality of elongate printed circuit board (PCB) connectors aligned in parallel thereon, the backpanel having a part extending beyond an end of the PCB connectors, the assembly including a plurality of power supply studs and a plurality of power supply pins, in respect of each of the PCB connectors, on said extending part of the backpanel, and printed circuit wiring interconnecting each power supply stud with at least one power supply pin and with the associated PCB connector, whereby power can be supplied to printed circuit boards, inserted into the PCB connectors, selectively via the associated power supply studs or via the associated power supply pins.

Thus either the power supply studs alone, or the power supply pins alone, or the studs and pins in combination, can be used to supply power to printed circuit boards when these are inserted into the PCB connectors.

In order to facilitate supplying power via the studs, preferably these are arranged in lines across the extending part of the backpanel, whereby corresponding studs associated with the different PCB connectors can be interconnected by a power supply bus for supplying power commonly to printed circuit boards inserted into the PCB connectors. The power supply studs and the power supply pins preferably extend from the extending part of the backpanel on opposite sides thereof, so that such power supply buses do not impede access to the pins, and vice versa.

In order that the power supply pins can carry a sufficiently high current, preferably the printed circuit wiring interconnects a plurality of power supply pins to a power supply stud.

The power supply pins are preferably arranged adjacent to an end edge of the extending part of the backpanel. This arrangement facilitates providing the backpanel assembly with an additional, power supply, backpanel arranged to extend in the same plane as the main backpanel from said end edge of the extending part thereof, the additional backpanel having, in respect of each of the PCB connectors on the main backpanel, a plurality of pins aligned with and adjacent to the respective power supply pins on the main backpanel, and a shroud surrounding the pins on the additional backpanel and the respective power supply pins on the main backpanel, said pins on the two backpanels and said shroud forming a power supply PCB connector into which a power supply PCB can be inserted for supplying power to a printed circuit board inserted into the respective PCB connector on the main backpanel, the additional backpanel additionally having means interconnecting corresponding pins for the different power supply PCB connectors for supplying power thereto.

Thus a backpanel assembly in accordance with the invention can initially comprise the main backpanel and be supplied with power via the power supply buses and studs from a single power source, and can subsequently be extended by removal of the power supply buses and provision of the additional, power supply backpanel as recited above with associated power supply PCBs, for individually powering the printed circuit boards inserted into the PCB connectors of the main backpanel. In view of the considerable complexity and consequent cost of the main backpanel, it is significant that a single backpanel can be provided regardless of which power supply option is desired.

The invention also extends to electronic equipment comprising a backpanel assembly as recited above, a plurality of printed circuit boards inserted into respective PCB connectors, and either:

a plurality of power supply buses each interconnecting the corresponding power supply studs for said respective PCB connectors for supplying power commonly to the printed circuit boards; or a like plurality of power supply PCBs inserted into corresponding power supply PCB connectors for supplying power individually to the first-mentioned printed circuit boards; or a smaller plurality of power supply PCBs inserted into power supply PCB connectors for supplying power individually to respective groups of the first-mentioned printed circuit boards, and a plurality of power supply buses each interconnecting the corresponding power supply studs for said respective groups for supplying power commonly to the printed circuit boards of each group.

The invention will be further understood from the following description with reference to the accompanying drawings, which are illustrative only and in which.

Figure 4:
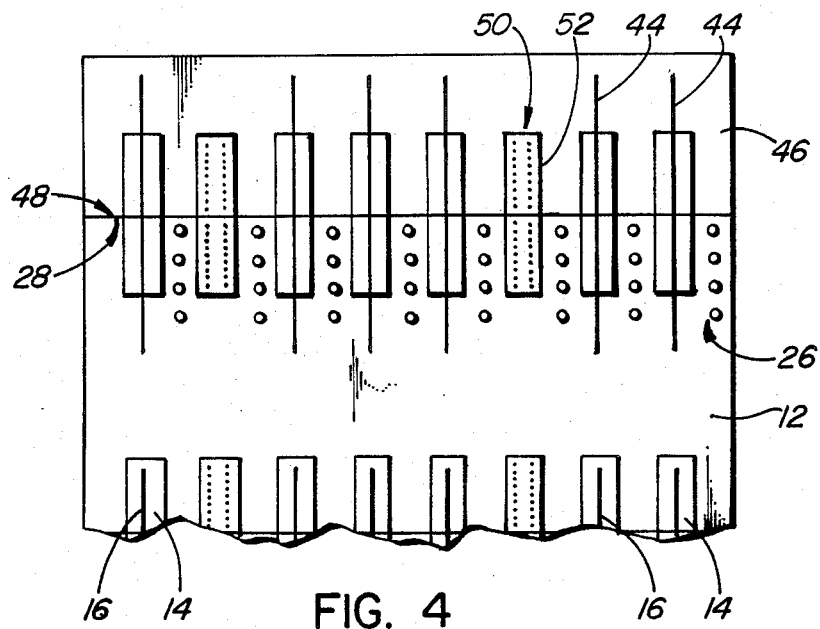
Figure 5:
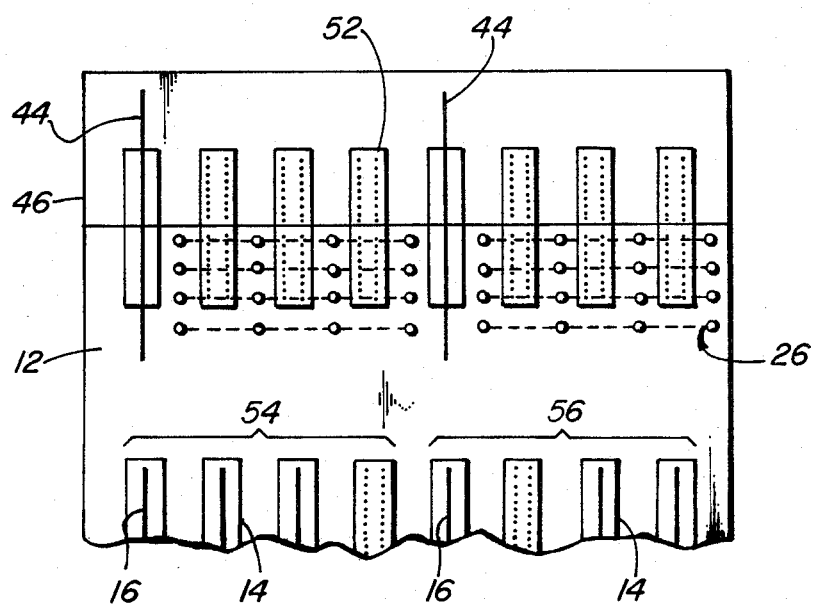

FIG. 4 illustrates part of the backpanel assembly with an additional power supply backpanel and power supply printed circuit boards for individually powering printed circuit boards on the main backpanel; and FIG. 5 illustrates part of the backpanel assembly with the additional power supply backpanel and power supply printed circuit boards for individually powering groups of printed circuit boards on the main backpanel.

Figure 1:
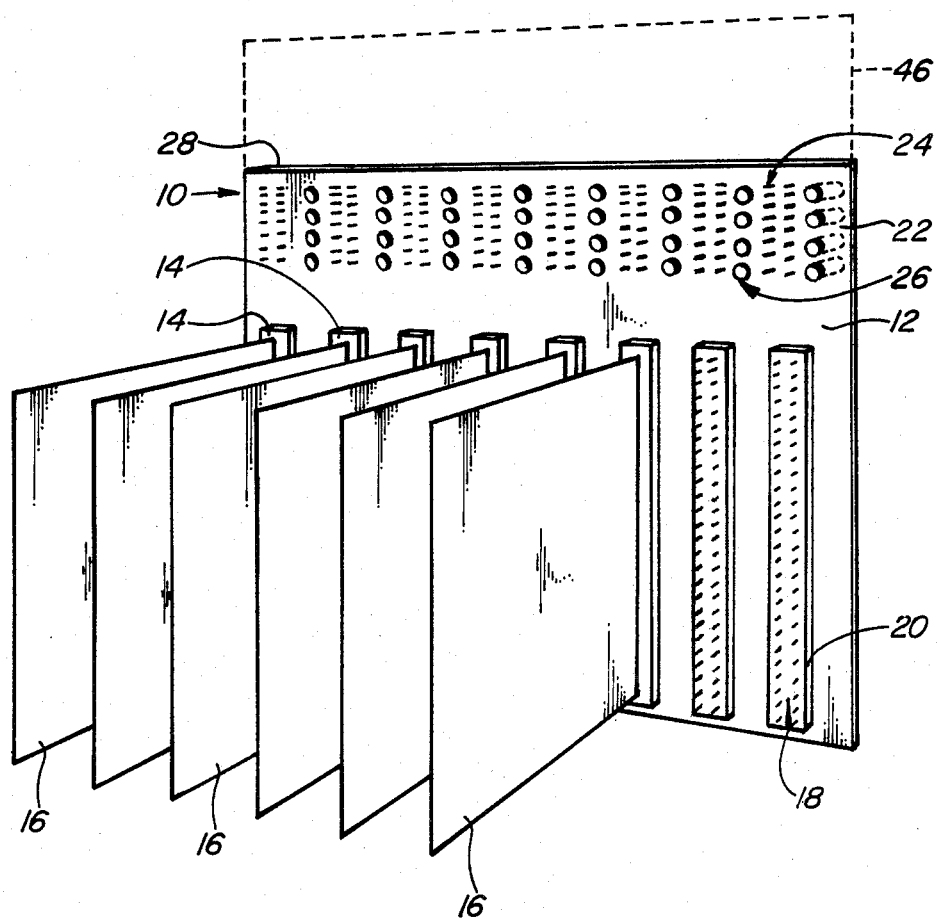
FIG. 1 is an illustration of a backpanel assembly in accordance with an embodiment of the invention, with printed circuit boards inserted into some of the PCB connectors thereon.

Referring to FIG. 1, there is illustrated a backpanel assembly 10 comprising a main backpanel 12 having a plurality of elongate printed circuit board (PCB) connectors 14 aligned in parallel thereon. For example 8 PCB connectors are shown, into 6 of which respective printed circuit cards or boards 16 are inserted. Although the connectors 14 can be of any known form, conveniently each connector 14 consists of two rows of pins 18 surrounded by a shroud 20 which serves to protect the pins and to guide a connector on a printed circuit board 16 into engagement and electrical contact with the pins when the PCB 16 is inserted into the connector 14. Arrangements of such pins and shrouds are known and are not further described here.

As illustrated in FIG. 1, the backpanel 12 extends upwardly beyond the upper ends of the connectors 14, its extended part 22 having thereon a set of power supply pins 24, and a set of power supply studs 26, in respect of each of the connectors 14. Like the rows of pins 18, each set of power supply pins 24 consists of two rows of pins which extend adjacent to an upper edge 28 of the backpanel 12. The power supply pins 24 are conveniently aligned with the pins 18 of the respective connectors 14.

Figure 2:
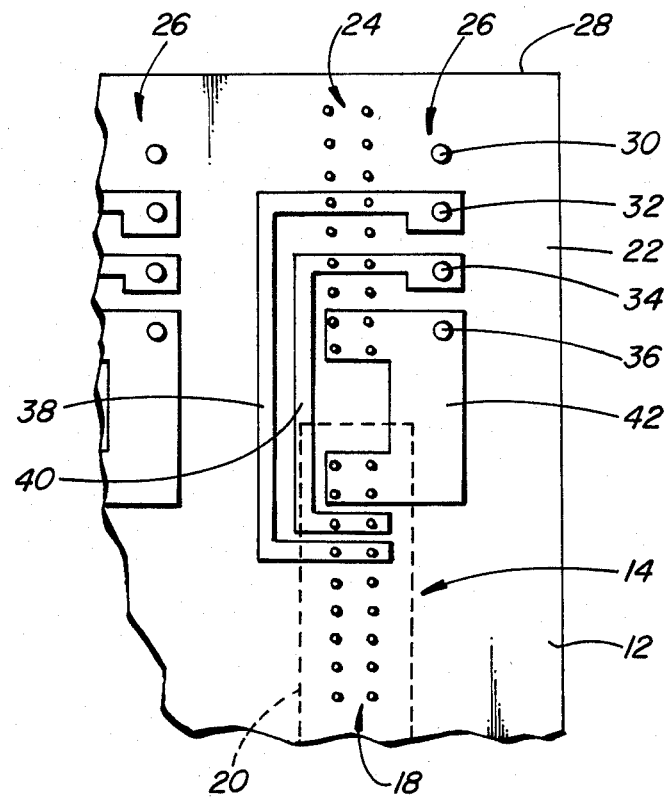
FIG. 2 illustrates in more detail part of the backpanel assembly of FIG. 1.

FIG. 2 illustrates in greater detail an arrangement of the pins 24 and studs 26 in relation to one of the connectors 14. The shroud 20 of the connector in FIG. 2 is represented by a broken line in order to distinguish it clearly from printed circuit wiring described below.

In FIG. 2 it is assumed that the backpanel 12 comprises a 4-layer printed circuit board having two signal circuit planes, one on each face of the board, and a power supply circuit plane and a ground plane sandwiched therebetween. It is also assumed that the power supply circuit plane has printed circuit wiring for three power supply lines, for example for voltages of $+5$ V, $+12$ V, and $-12$ V relative to ground. Accordingly, in FIG. 2 each set of power supply studs 26 consists of four studs 30, 32, 34, and 36 which are respectively connected to the ground plane (not shown, for the sake of clarity), a $+12$ V power supply printed circuit track 38, a $-12$ V power supply printed circuit track 40, and a 5 V power supply printed circuit track 42, which is wider than the tracks 38 and 40 to enable it to carry a greater current.

As illustrated in FIG. 2, the tracks 38, 40, and 42 provide electrical connections between the power supply studs 32, 34, and 36, respective pins of the associated connector 14, and respective power supply pins 24. For example FIG. 2 illustrates each of the tracks 38 and 40 connecting to two of the pins 24 and two of the pins 18, and illustrates the track 42 connecting to four of the pins 24 and four of the pins 18. These tracks are individually provided in respect of the different connectors 14, so that printed circuit boards inserted into the respective connectors 14 are supplied with power separately from their respective sets of power supply pins 18 or 24.

In a similar manner, each stud 30 is connected via the ground plane to another one or more of the pins 18 and to other pins 24 of the respective connector 14. The ground plane may extend commonly between the various connectors 14 and the respective power supply studs and pins. For example, as shown in FIG. 2 the uppermost six power supply pins 24, i.e. those nearest to the upper edge 28 of the backpanel 12, may be connected to the ground plane. Other pins 24, which are not connected as illustrated in FIG. 2, may also be connected to the ground plane 24 to provide additional ground connections, or may be connected to one of the signal planes to provide signal path connections, or may be omitted.

Figure 3:
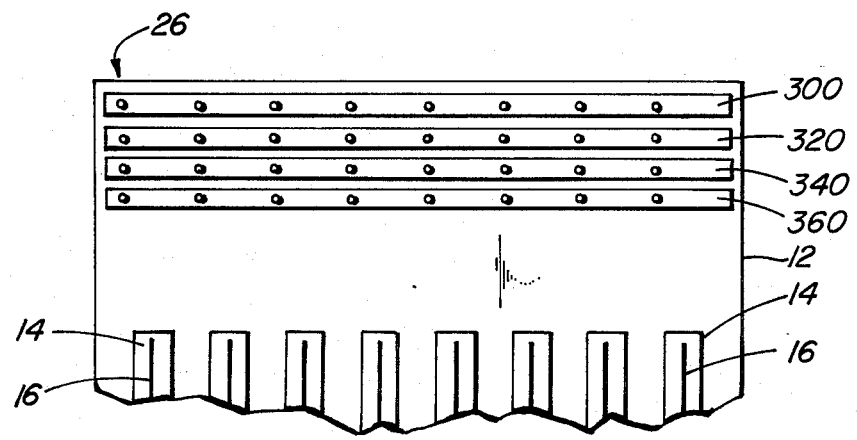
FIG. 3 illustrates part of the backpanel assembly with a power bus arrangement for commonly powering the printed circuit boards from a single power source.

In FIGS. 1 and 2 it is assumed that the pins 24 extend from the backpanel 12 towards the viewer, whereas the studs 26 extend from the opposite face of the backpanel 12 away from the viewer, so that only the back ends of the studs are shown in FIGS. 1 and 2. FIG. 3 illustrates part of the reverse side of the backpanel 12, showing that printed circuit boards 16 may also be inserted in connectors 14 additionally provided on this reverse side of the backpanel 12. The pins 18 conveniently extend completely through the backpanel 12 to form parts of the connectors 14 on both sides of the backpanel in known manner.

In FIG. 3 the corresponding studs 30, 32, 34, and 36 of the different sets of power supply studs 26 are interconnected by a plurality of power supply buses 300, 320, 340, and 360 respectively which extend transversely across the backpanel 12. For example each power supply bus consists of a conductive metal bar having holes therein through which the respective studs extend, the studs being threaded and provided with nuts (not shown) to clamp the bar to the studs. Thus by connection of power supply voltages to the power supply buses 300, 320, 340, and 360 from a single power supply, all of the printed circuit boards 16 are commonly supplied with power.

Referring now to FIG. 4, an arrangement is illustrated for supplying the printed circuit boards 16 with power from individual power supplies on power supply PCBs 44, which are themselves supplied with power from a common, reliable, power source. For example each individual power supply on a PCB 44 consists of d.c. to d.c. converters for producing the desired power supply voltages from the 48 volt power supply of a telephone central office.

To this end the arrangement of FIG. 4 includes an additional, power supply, backpanel 46 (the position of which is also illustrated in broken lines in FIG. 1) which is the same width as the backpanel 12 and which is mounted to extend upwardly therefrom in the same plane as the backpanel 12. The backpanel 46 has a lower edge 48 which abuts the upper edge 28 of the backpanel 12 so that the two backpanels are contiguous.

In the same manner that the sets of pins 24 extend upwardly on the backpanel 12 to its upper edge 28, corresponding sets of pins 50 extend on the backpanel 46 downwardly to its lower edge 48, to line up with the pins 24. In addition, shrouds 52 are mounted on the backpanel 46 to extend beyond its lower edge 48, each shroud 52 surrounding a respective set of pins 50, and also surrounding the corresponding set of pins 24 on the backpanel 12 when the two backpanels are contiguously arranged as in FIG. 4, to form therewith a respective PCB connector for a power supply PCB 44. Thus the connectors formed by the shrouds 52 are similar to the connectors 14, except that they bridge the edges 28, 48 of the backpanels and surround and align pins on both backpanels. The shrouds 52 can optionally also be secured to the backpanel 12.

For each connector 14 into which a printed circuit board 16 is inserted, a power supply PCB 44 is inserted into the corresponding connector formed by a shroud 52, pins 50, and pins 24, to supply the board 16 individually. Printed circuit wiring (not shown) on the backpanel 46 serves to supply power from the common, reliable, power source to respective ones of each set of pins 50, from whence power is delivered to the individual boards 16 via the d.c. to d.c. converters on the respective power supply PCB 44, the respective set of pins 24, and the respective printed circuit wiring of the backpanel 12 described above with reference to FIG. 2.

Instead of supplying all of the PCBs 16 commonly as in FIG. 3 or individually as in FIG. 4, groups of PCBs 16 may be supplied with power individually, with the PCBs in each group supplied commonly. For example, FIG. 5 illustrates an arrangement for supplying power individually via the backpanel 46 and two power supply PCBs 44, to two groups 54, 56 of connectors 14, and thence to PCBs 16 inserted into these connectors, the connectors 14 of each group being powered commonly by respective power supply buses interconnecting the power supply studs 26 associated with these connectors. Thus in FIG. 5 there are two sets of power supply buses, shown by broken lines because they are on the reverse side of the backpanel 12, which interconnect the left-hand four and the right hand four sets of power supply studs 26 respectively. The power supply buses and the power supply PCBs 44 and their connectors do not interfere physically with one another because they are on opposite sides of the backpanels.

Although particular embodiments of the invention have been described in detail, many modifications, variations, and adaptations may be made thereto without departing from the scope of the invention, which is defined by the claims.

What is claimed is:

1. A backpanel assembly comprising a main backpanel having a plurality of elongate printed circuit board (PCB) connectors aligned in parallel thereon, the backpanel having a part extending beyond an end of the PCB connectors, the assembly including a plurality of power supply studs and a plurality of power supply pins, in respect of each of the PCB connectors, on said extending part of the backpanel, and printed circuit wiring interconnecting each power supply stud with at least one power supply pin and with the associated PCB connector, whereby power can be supplied to printed circuit boards, inserted into the PCB connectors, selectively via the associated power supply studs or via the associated power supply pins.

2. A backpanel assembly as claimed in claim 1 wherein the power supply studs are arranged in lines across the extending part of the backpanel, whereby corresponding studs associated with the different PCB connectors can be interconnected by a power supply bus for supplying power commonly to printed circuit boards inserted into the PCB connectors.

3. A backpanel assembly as claimed in claim 1 wherein the power supply studs and the power supply pins extend from the extending part of the backpanel on opposite sides thereof.

4. A backpanel assembly as claimed in claim 1 wherein said printed circuit wiring interconnects a plurality of power supply pins to a power supply stud.

5. A backpanel assembly as claimed in claim 1 wherein said power supply pins are arranged adjacent to an end edge of the extending part of the backpanel.

6. A backpanel assembly as claimed in claim 5 and including an additional, power supply, backpanel arranged to extend in the same plane as the main backpanel from said end edge of the extending part thereof, the additional backpanel having, in respect of each of the PCB connectors on the main backpanel, a plurality of pins aligned with and adjacent to the respective power supply pins on the main backpanel, and a shroud surrounding the pins on the additional backpanel and the respective power supply pins on the main backpanel, said pins on the two backpanels and said shroud forming a power supply PCB connector into which a power supply PCB can be inserted for supplying power to a printed circuit board inserted into the respective PCB connector on the main backpanel, the additional backpanel additionally having means interconnecting corresponding pins for the different power supply PCB connectors for supplying power thereto.

7. A backpanel assembly as claimed in claim 6 wherein the power supply studs are arranged in lines across the extending part of the main backpanel, the power supply studs and the power supply pins extending from the main backpanel on opposite sides thereof, whereby corresponding studs associated with different PCB connectors can be interconnected by a power supply bus for supplying power commonly to printed circuit boards inserted into the respective PCB connectors.

8. Electronic equipment comprising a backpanel assembly as claimed in claim 2, a plurality of printed circuit boards inserted into respective PCB connectors, and a plurality of power supply buses each interconnecting the corresponding power supply studs for said respective PCB connectors for supplying power commonly to the printed circuit boards.

9. Electronic equipment comprising a backpanel assembly as claimed in claim 6, a plurality of printed circuit boards inserted into respective PCB connectors on the main backpanel, and a like plurality of power supply PCBs inserted into corresponding power supply PCB connectors for supplying power individually to the first-mentioned printed circuit boards.

10. Electronic equipment comprising a backpanel assembly as claimed in claim 7, a plurality of printed circuit boards inserted into respective PCB connectors on the main backpanel, a smaller plurality of power supply PCBs inserted into power supply PCB connectors for supplying power individually to respective groups of the first-mentioned printed circuit boards, and a plurality of power supply buses each interconnecting the corresponding power supply studs for said respective groups for supplying power commonly to the printed circuit boards of each group.

* * * * *